United States Patent
Campbell et al.

(10) Patent No.: US 7,978,472 B2
(45) Date of Patent: Jul. 12, 2011

(54) LIQUID-COOLED COOLING APPARATUS, ELECTRONICS RACK AND METHODS OF FABRICATION THEREOF

(75) Inventors: Levi A. Campbell, Poughkeepsie, NY (US); Richard C. Chu, Poughkeepsie, NY (US); Michael J. Ellsworth, Jr., Poughkeepsie, NY (US); Madhusudan K. Iyengar, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 12/481,824

(22) Filed: Jun. 10, 2009

(65) Prior Publication Data
US 2010/0313590 A1 Dec. 16, 2010

(51) Int. Cl.
*H05K 7/20* (2006.01)
*F28F 7/00* (2006.01)
*H01L 23/34* (2006.01)

(52) U.S. Cl. .................. 361/699; 361/679.53; 361/702; 361/724; 361/727; 165/80.4; 165/80.5; 165/104.33; 174/15.1; 257/714

(58) Field of Classification Search ............ 361/679.47, 361/679.52–679.53, 699, 700, 701, 702, 361/724–727; 165/80.4–80.5, 104.33, 185; 174/15.1–15.2; 257/714–715
See application file for complete search history.

(56) References Cited

U.S. PATENT DOCUMENTS

| | | | |
|---|---|---|---|
| 5,353,192 A * | 10/1994 | Nordin | 361/700 |
| 5,740,018 A * | 4/1998 | Rumbut, Jr. | 361/720 |
| 6,055,157 A | 4/2000 | Bartilson | |
| 6,351,381 B1 * | 2/2002 | Bilski et al. | 361/695 |
| 6,388,882 B1 | 5/2002 | Hoover et al. | |
| 6,411,512 B1 | 6/2002 | Mankaruse et al. | |
| 6,536,510 B2 | 3/2003 | Khrustalev et al. | |

(Continued)

FOREIGN PATENT DOCUMENTS
EP 0 316 129 A1 5/1989
(Continued)

OTHER PUBLICATIONS

Berry et al., "Dockable Server Concepts", Intel Corporation, Intel Developer Forum, pp. 1-40 (Feb. 25, 2002).

(Continued)

*Primary Examiner* — Zachary M Pape
(74) *Attorney, Agent, or Firm* — Dennis Jung, Esq.; Kevin P. Radigan, Esq.; Heslin Rothenberg Farley & Mesiti P.C.

(57) ABSTRACT

Liquid-cooled electronics racks and methods of fabrication are provided wherein a liquid-based cooling apparatus facilitates cooling of electronic subsystems when docked within the electronics rack. The cooling apparatus includes a liquid-cooled cooling structure mounted to a front of the rack, and a plurality of heat transfer elements. The cooling structure is a thermally conductive material which has a coolant-carrying channel for facilitating coolant flow through the structure. Each heat transfer element couples to one or more heat-generating components of a respective electronic subsystem, physically contacts the cooling structure when that electronic subsystem is docked within the rack, and provides a thermal transport path from the heat-generating components of the electronic subsystem to the liquid-cooled cooling structure. Advantageously, electronic subsystems may be docked within or undocked from the electronics rack without affecting flow of coolant through the liquid-cooled cooling structure.

23 Claims, 10 Drawing Sheets

U.S. PATENT DOCUMENTS

| | | | |
|---|---|---|---|
| 6,657,121 | B2 | 12/2003 | Garner |
| 6,796,372 | B2 | 9/2004 | Bear |
| 6,836,407 | B2 | 12/2004 | Faneuf et al. |
| 7,012,807 | B2 | 3/2006 | Chu et al. |
| 7,312,987 | B1 | 12/2007 | Konshak |
| 7,450,385 | B1 | 11/2008 | Campbell et al. |
| 7,466,549 | B2 * | 12/2008 | Dorrich et al. ............... 361/699 |
| 7,639,499 | B1 * | 12/2009 | Campbell et al. ............. 361/699 |
| 7,675,748 | B2 * | 3/2010 | Matsushima et al. .... 361/679.53 |
| 7,692,924 | B2 * | 4/2010 | Wavering et al. ............. 361/699 |
| 2002/0114139 | A1 | 8/2002 | Bash et al. |
| 2003/0128515 | A1 * | 7/2003 | Faneuf et al. ................. 361/700 |
| 2004/0150949 | A1 | 8/2004 | Belady et al. |
| 2005/0041391 | A1 | 2/2005 | Wycraft et al. |
| 2005/0068728 | A1 | 3/2005 | Chu et al. |
| 2007/0291452 | A1 * | 12/2007 | Gilliland et al. ............. 361/699 |
| 2007/0297136 | A1 | 12/2007 | Konshak |

FOREIGN PATENT DOCUMENTS

JP  6-260784 A1  9/1994

OTHER PUBLICATIONS

"Removable Modular Power Supply with Heat Pipes Interconnecting a Horizontally Disposed Base and a Vertically Disposed Attachment to a Cold Plate", IBM Technical Disclosure Bulletin, p. 3062 (Dec. 1985).

Notification of Transmittal of the International Search Report and the Written Opinion of the International Searching Authority, or the Declaration; International Search Report; and Written Opinion, issued by the European Patent Office for International Application No. PCT/EP2010/056452, dated Aug. 18, 2010.

* cited by examiner

LIQUID-COOLED COOLING APPARATUS, ELECTRONICS RACK AND METHODS OF FABRICATION THEREOF

TECHNICAL FIELD

The present invention relates to heat transfer mechanisms, and more particularly, to cooling apparatuses, liquid-cooled electronics racks and methods of fabrication thereof for removing heat generated by one or more electronic subsystems. Still more particularly, the present invention relates to cooling apparatuses and cooled electronics racks comprising a front-mounted, liquid-cooled cooling structure for the electronics rack.

BACKGROUND OF THE INVENTION

As is known, operating electronic devices produce heat. This heat should be removed from the devices in order to maintain device junction temperatures within desirable limits, with failure to remove heat effectively resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

The need to cool current and future high heat load, high heat flux electronic devices and systems therefore mandates the development of aggressive thermal management techniques using liquid cooling.

SUMMARY OF THE INVENTION

In one aspect, the shortcomings of the prior art are overcome and additional advantages are provided through the provision of a cooling apparatus for facilitating cooling of an electronic subsystem. The cooling apparatus includes a liquid-cooled cooling structure and a heat transfer element. The liquid-cooled cooling structure is configured to mount to a front of a housing within which the electronic subsystem is configured to dock. The electronic subsystem is slidable relative to the housing for docking or undocking thereof relative to the housing through the front of the housing. The liquid-cooled cooling structure includes a thermally conductive material and comprises at least one coolant-carrying channel extending therethrough. The heat transfer element is configured to couple to one or more heat-generating components of the electronic subsystem, and is configured to physically contact the liquid-cooled cooling structure when the liquid-cooled cooling structure is mounted to the front of the housing, the heat transfer element is coupled to the one or more heat-generating components of the electronic subsystem and the electronic subsystem is docked within the housing, wherein the heat transfer element provides a thermal transport path from the one or more heat-generating components of the electronic subsystem to the liquid-cooled cooling structure, and the electronic subsystem is dockable within or undockable from the housing without affecting flow of coolant through the liquid-cooled cooling structure.

In another aspect, a liquid-cooled electronics rack is provided which includes an electronics rack comprising a plurality of subsystem docking ports, a plurality of electronic subsystems slidable relative to the plurality of subsystem docking ports through a front of the electronics rack for docking or undocking thereof relative to the electronics rack, and a cooling apparatus for facilitating cooling of the plurality of electronic subsystems when docked within the electronics rack. The cooling apparatus includes a liquid-cooled cooling structure mounted to a front of the electronics rack, and a plurality of heat transfer elements. The liquid-cooled cooling structure includes a thermally conductive material and comprises at least one coolant-carrying channel extending therethrough. Each heat transfer element is coupled to one or more heat-generating components of a respective electronic subsystem of the plurality of electronic subsystems, and configured to physically contact the liquid-cooled cooling structure when the respective electronic subsystem is docked within the electronics rack, wherein each heat transfer element provides a thermal transport path from the one or more heat-generating components of the respective electronic subsystem to the liquid-cooled cooling structure, and wherein the plurality of electronic subsystems are dockable within or undockable from the electronics rack without affecting flow of coolant through the liquid-cooled cooling structure.

In a further aspect, a method of fabricating a liquid-cooled electronics rack is provided. The method includes: employing an electronics rack comprising a plurality of subsystem docking ports, and a plurality of electronic subsystems slidable relative to the plurality of subsystem docking ports for docking or undocking thereof relative to the electronics rack; and providing a cooling apparatus for facilitating cooling of the plurality of electronic subsystems when docked within the electronics rack. The providing of the cooling apparatus includes: mounting a liquid-cooled cooling structure to the electronics rack adjacent to the plurality of subsystem docking ports, the liquid-cooled cooling structure comprising a thermally conductive material and comprising at least one coolant-carrying channel extending therethrough; and providing a plurality of heat transfer elements and securing each heat transfer element to one or more heat-generating components of a respective electronic subsystem of the plurality of electronic subsystems, each heat transfer element being configured to physically contact the liquid-cooled cooling structure when the respective electronic subsystem is docked within the electronics rack, wherein each heat transfer element provides a thermal transport path from the one or more heat-generating components of the respective electronic subsystem to the liquid-cooled cooling structure, and wherein the electronic subsystems are dockable within or undockable from the electronics rack without affecting flow of coolant through the liquid-cooled cooling structure.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
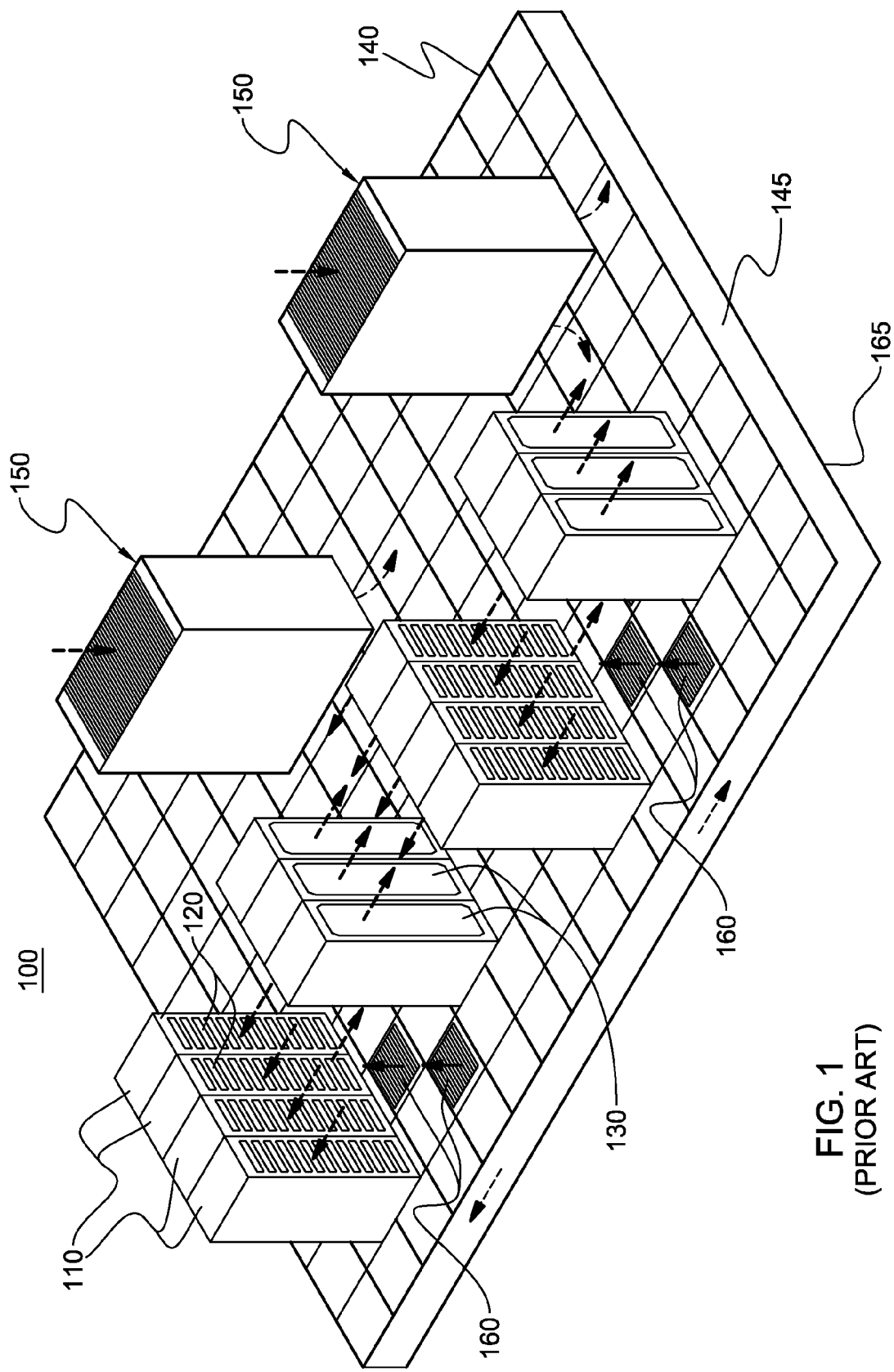
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system or electronic system, and may be, for example, a stand alone computer processor having high, mid or low end processing capability. In one embodiment, an electronics rack may comprise multiple electronic subsystems or drawers, each having one or more heat-generating components disposed therein requiring cooling. "Electronic subsystem" refers to any sub-housing, blade, book, drawer, node, compartment, etc., having one or more heat-generating electronic devices disposed therein. Each electronic subsystem of an electronics rack may be movable or fixed relative to the electronics rack, with the rack-mounted electronic drawers and blades of a blade center system being two examples of subsystems of an electronics rack to be cooled.

"Heat-generating component" or "electronic component" refers to any heat-generating electronic device of, for example, a computer system or other electronic subsystem or unit requiring cooling. By way of example, an electronic component may comprise one or more integrated circuit dies (or chips) and/or other electronic devices to be cooled, including one or more processor chips, memory chips and memory support chips. As a further example, the electronic component may comprise one or more bare dies or one or more packaged dies disposed on a common carrier. As used herein, "primary heat-generating component" refers to a primary heat-generating electronic device within an electronic subsystem, while "secondary heat-generating component" refers to an electronic device of the electronic subsystem generating less heat than the primary heat-generating component to be cooled. "Primary heat-generating die" refers, for example, to a primary heat-generating die or chip within a heat-generating electronic device comprising primary and secondary heat-generating dies (with a processor die being one example). "Secondary heat-generating die" refers to a die of a multi-die electronic device generating less heat than the primary heat-generating die thereof (with memory dies and memory support dies being examples of secondary dies to be cooled). As one example, a heat-generating electronic device could comprise multiple primary heat-generating bare dies and multiple secondary heat-generating dies on a common carrier. Further, the term "cold plate" refers to any thermally conductive structure having one or more channels or passageways formed therein for flowing of coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the cooling concepts disclosed herein are readily adapted to use with other types of coolant on the facility side and/or on the system side. For example, one or more of the coolants may comprise a brine, a fluorocarbon liquid, a hydrofluoroether liquid, a liquid metal, or other similar coolant, or refrigerant, while still maintaining the advantages and unique features of the present invention.

Reference is made below to the drawings, which are not drawn to scale to facilitate understanding thereof, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Figure 2:
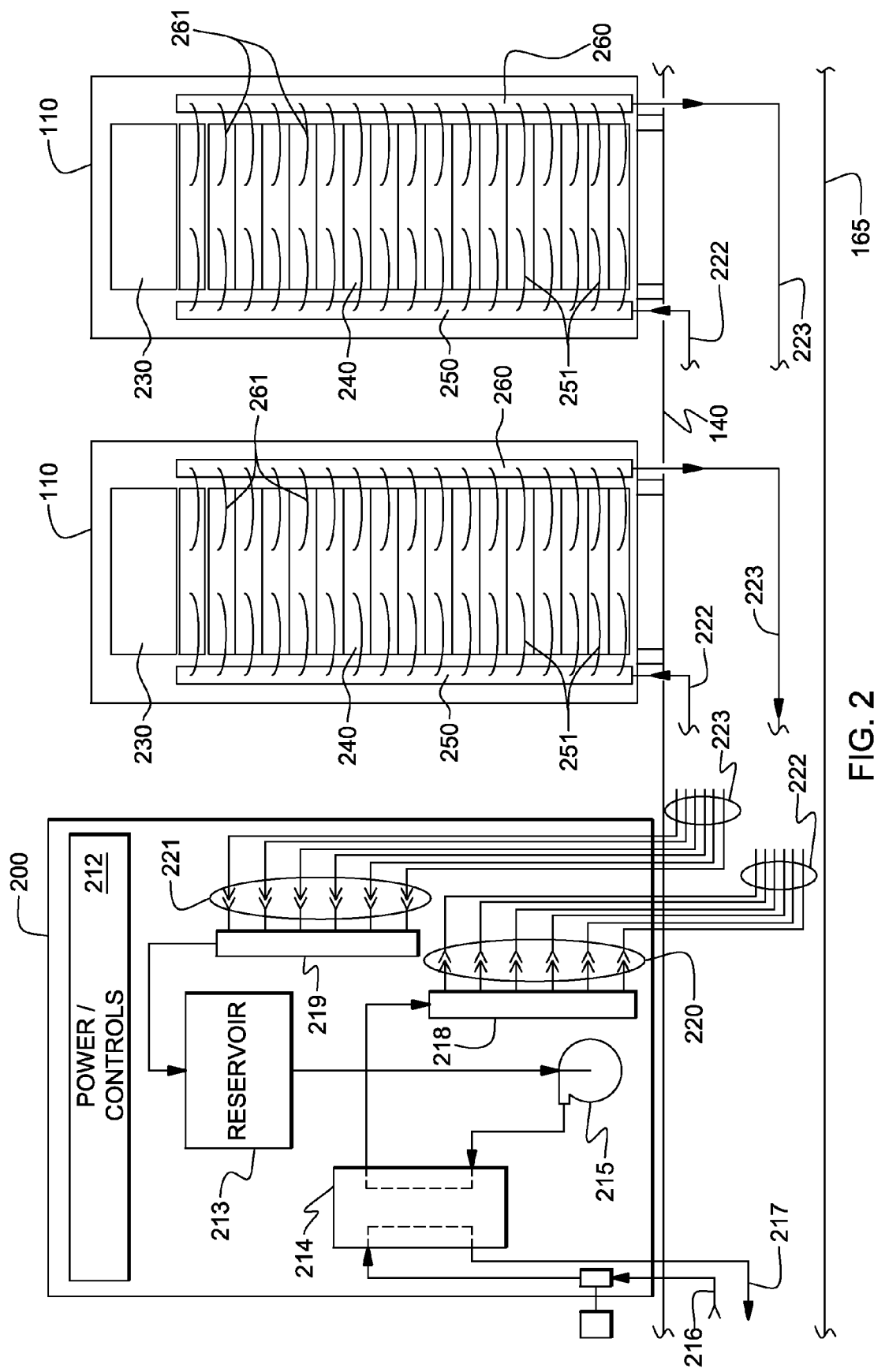
FIG. 2 depicts one embodiment of a coolant distribution unit for liquid-cooling of one or more electronics racks of a data center, in accordance with an aspect of the present invention.
Figure 3:
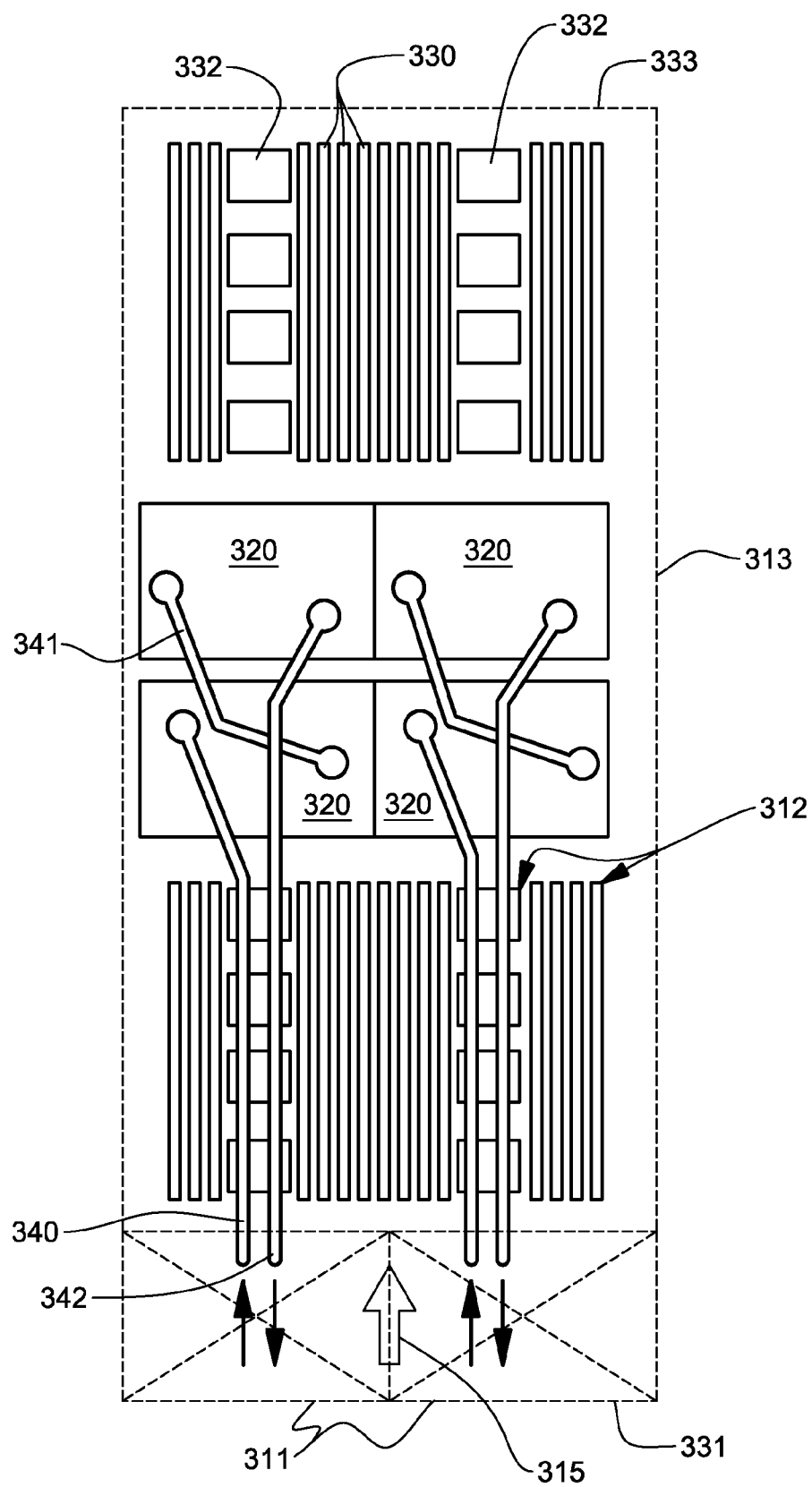
FIG. 3 is a plan view of one embodiment of an electronic subsystem layout illustrating an air and liquid cooling system for cooling components of the electronic subsystem, in accordance with an aspect of the present invention.
Figure 4:
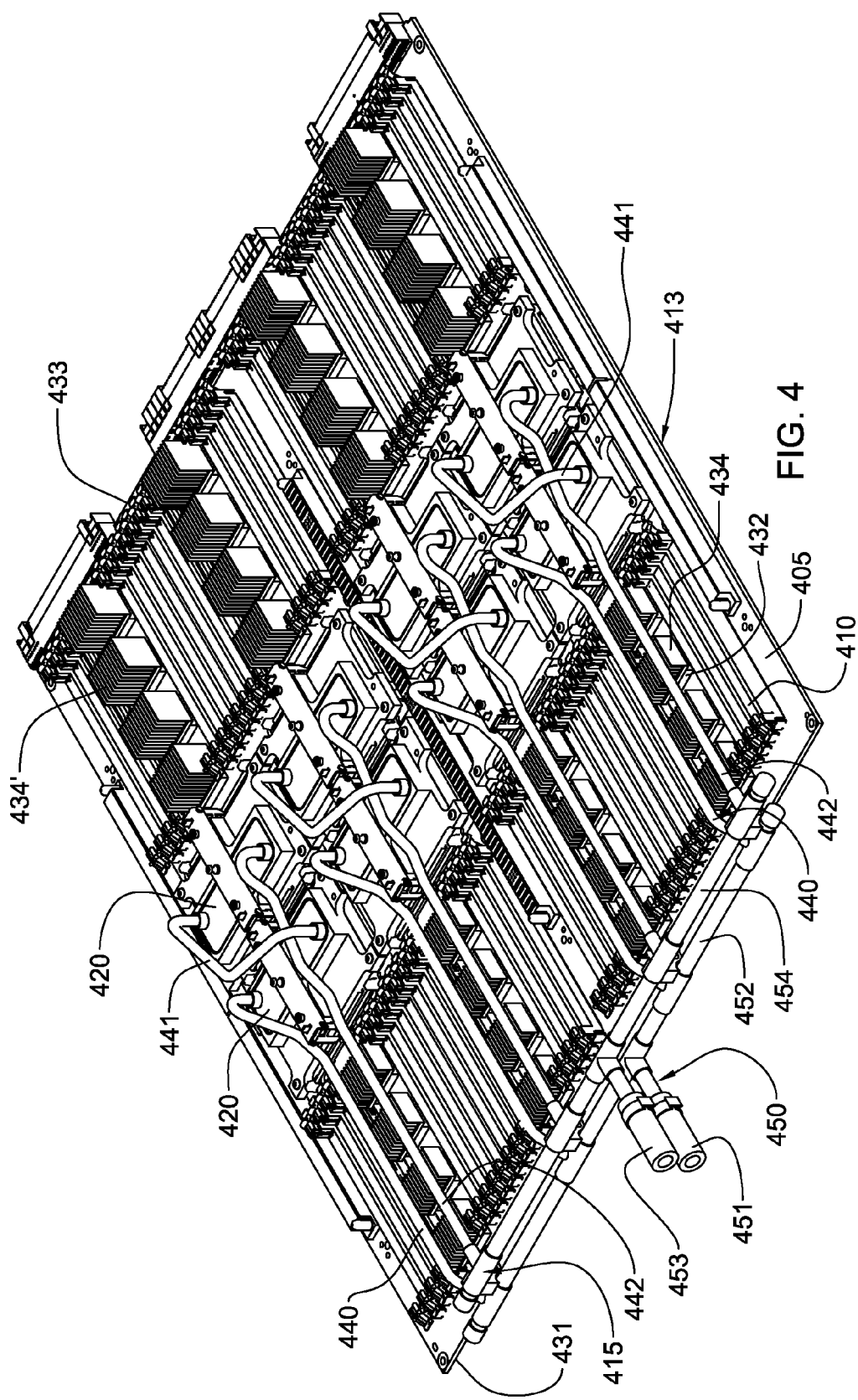
FIG. 4 depicts one detailed embodiment of a partially assembled electronic subsystem layout, wherein the electronic subsystem includes eight heat-generating electronic components or devices to be cooled, each having a respective cooling device associated therewith, in accordance with an aspect of the present invention.

Due to the ever-increasing airflow requirements through electronics racks, and the limits of air distribution within the typical data center installation, liquid-based cooling is being combined with the conventional air-cooling. FIGS. 2-4 illustrate one embodiment of a data center implementation employing a liquid-based cooling system with one or more cold plates coupled to high heat-generating electronic devices disposed within the electronics racks.

FIG. 2 depicts, in part, one embodiment of a coolant distribution unit 200 for a data center. The coolant distribution unit is conventionally a large unit which occupies what would be considered a full electronics frame. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 110 via couplings 220 and lines 222, and a return manifold 219 receiving water from the electronics racks 110, via lines 223 and couplings 221. Each electronics rack includes (in one example) a power/control unit 230 for the electronics rack, multiple electronic subsystems 240, a system coolant supply manifold 250, and a system coolant return manifold 260. As shown, each electronics rack 110 is disposed on raised floor 140 of the data center with lines 222 providing system coolant to system coolant supply manifolds 250 and lines 223 facilitating return of system coolant from system coolant return manifolds 260 being disposed in the supply air plenum beneath the raised floor.

In the embodiment illustrated, the system coolant supply manifold 250 provides system coolant to the cooling systems of the electronic subsystems (more particularly, to liquid-cooled cold plates thereof) via flexible hose connections 251, which are disposed between the supply manifold and the respective electronic subsystems within the rack. Similarly, system coolant return manifold 260 is coupled to the electronic subsystems via flexible hose connections 261. Quick connect couplings may be employed at the interface between flexible hoses 251, 261 and the individual electronic subsystems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic subsystem 313 component layout wherein one or more air moving devices 311 provide forced air flow 315 to cool multiple components 312 within electronic subsystem 313. Cool air is taken in through a front 331 and exhausted out a back 333 of the subsystem. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic subsystem 313, and partially arrayed near back 333 of electronic subsystem 313. Also, in the embodiment of FIG. 3, memory modules 330 and the memory support modules 332 are cooled by air flow 315 across the electronic subsystem.

The illustrated liquid-based cooling system further includes multiple coolant-carrying tubes connected to and in fluid communication with liquid-cooled cold plates 320. The coolant-carrying tubes comprise sets of coolant-carrying tubes, with each set including (for example) a coolant supply tube 340, a bridge tube 341 and a coolant return tube 342. In this example, each set of tubes provides liquid coolant to a series-connected pair of cold plates 320 (coupled to a pair of processor modules). Coolant flows into a first cold plate of each pair via the coolant supply tube 340 and from the first cold plate to a second cold plate of the pair via bridge tube or line 341, which may or may not be thermally conductive. From the second cold plate of the pair, coolant is returned through the respective coolant return tube 342.

FIG. 4 depicts in greater detail an alternate electronic subsystem layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is cooled and conditioned water.

FIG. 4 is an isometric view of one embodiment of an electronic subsystem or drawer, and monolithic cooling system. The depicted planar server assembly includes a multilayer printed circuit board to which memory DIMM sockets and various electronic devices to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to facilitate cooling one or more electronic devices to which the cold plates are mechanically and thermally coupled. The number of parallel paths and the number of series-connected liquid-cooled cold plates depends, for example, on the desired device temperature, available coolant temperature and coolant flow rate, and the total heat load being dissipated from each electronic device.

More particularly, FIG. 4 depicts a partially assembled electronic subsystem 413 and an assembled liquid-based cooling system 415 coupled to primary heat-generating components (e.g., including processor dies) to be cooled. In this embodiment, the electronics system is configured for (or as) an electronics drawer of an electronics rack, and includes, by way of example, a support substrate or planar board 405, a plurality of memory module sockets 410 (with the memory modules (e.g., dual in-line memory modules) not shown), multiple rows of memory support modules 432 (each having coupled thereto an air-cooled heat sink 434), and multiple processor modules (not shown) disposed below the liquid-cooled cold plates 420 of the liquid-based cooling system 415.

In addition to liquid-cooled cold plates 420, liquid-based cooling system 415 includes multiple coolant-carrying tubes, including coolant supply tubes 440 and coolant return tubes 442 in fluid communication with respective liquid-cooled cold plates 420. The coolant-carrying tubes 440, 442 are also connected to a header (or manifold) subassembly 450 which facilitates distribution of liquid coolant to the coolant supply tubes and return of liquid coolant from the coolant return tubes 442. In this embodiment, the air-cooled heat sinks 434 coupled to memory support modules 432 closer to front 431 of electronic subsystem 413 are shorter in height than the air-cooled heat sinks 434' coupled to memory support modules 432 near back 433 of electronic subsystem 413. This size difference is to accommodate the coolant-carrying tubes 440, 442 since, in this embodiment, the header subassembly 450 is at the front 431 of the electronics drawer and the multiple liquid-cooled cold plates 420 are in the middle of the drawer.

Liquid-based cooling system 415 comprises a pre-configured monolithic structure which includes multiple (pre-assembled) liquid-cooled cold plates 420 configured and disposed in spaced relation to engage respective heat-generating electronic devices. Each liquid-cooled cold plate 420 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 420 to the associated electronic device to form the cold plate and electronic device assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 4, header subassembly 450 includes two liquid manifolds, i.e., a coolant supply header 452 and a coolant return header 454, which in one embodiment, are coupled together via supporting brackets. In the monolithic cooling structure of FIG. 4, the coolant supply header 452 is metallurgically bonded in fluid communication to each coolant supply tube 440, while the coolant return header 454 is metallurgically bonded in fluid communication to each coolant return tube 442. A single coolant inlet 451 and a single coolant outlet 453 extend from the header subassembly for coupling to the electronics rack's coolant supply and return manifolds (not shown).

FIG. 4 also depicts one embodiment of the pre-configured, coolant-carrying tubes. In addition to coolant supply tubes 440 and coolant return tubes 442, bridge tubes or lines 441 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 440, bridge tubes 441 and coolant return tubes 442 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

An issue with the above-described liquid-based cooling system is the presence of multiple liquid connections, for example, between the header subassemblies and the rack-level coolant supply and return manifolds, and that multiple ones of these connections would need to be broken to allow for removal and/or replacement of an electronic subsystem or a component within an electronic subsystem within the rack. This can be problematic if the electronics rack is in the field and operational when the replacement is to occur. Multiple liquid connections are therefore undesirable from both a reliability and a serviceability standpoint. In addition, by employing coolant conduit connections to cold plates within the electronic subsystems, there is the undesirable possibility of coolant, such as water, leaking onto active circuit components, and the resulting damage which could occur. Described hereinbelow therefore (with reference to FIGS. 5A-10), is an alternate liquid-based cooling approach which provides the advantages of liquid-cooling to electronic subsystems, such as "blade-like" packages, without the need to break fluid connections for servicing or removal of an electronic subsystem or one or more components within an electronic subsystem positioned within the rack, and without any coolant being present or brought into the interior of the electronic subsystem or interior of the electronics frame.

Figure 5A:
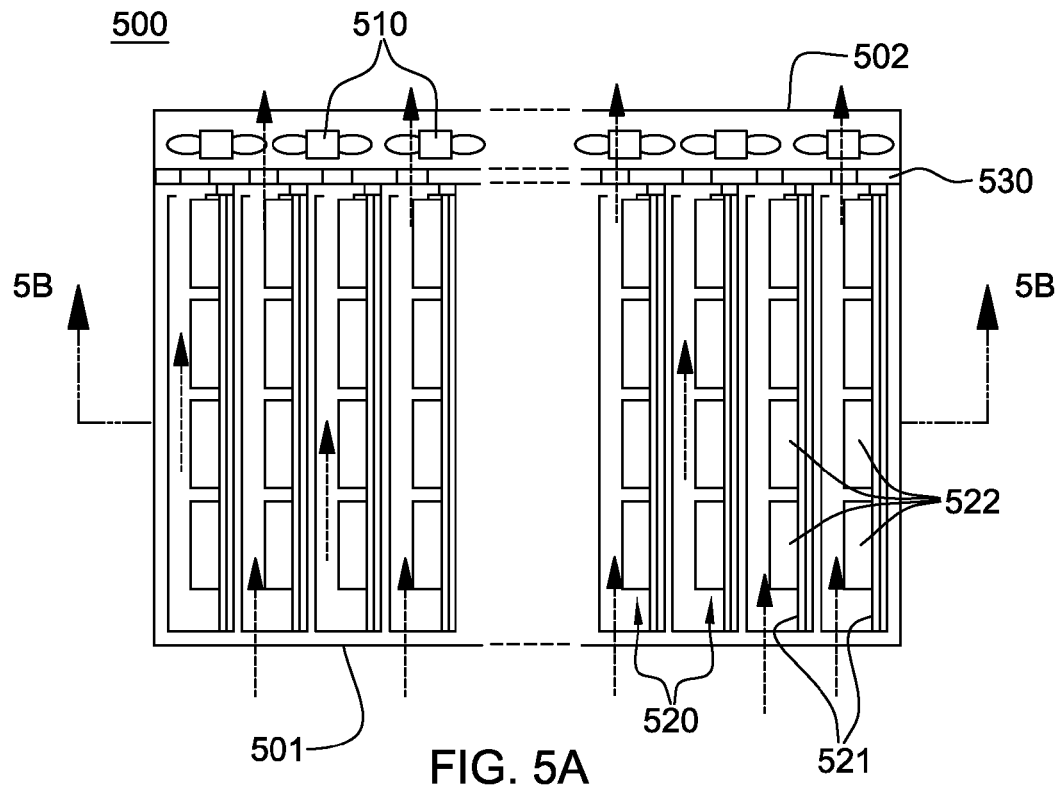
FIG. 5A is a cross-sectional plan view of another embodiment of an air-cooled electronics rack to be modified with a liquid-cooled cooling apparatus, in accordance with another aspect of the present invention.

FIGS. 5A-6B illustrate an alternate electronics rack embodiment cooled by forced-air cooling. As illustrated in FIGS. 5A & 6A, room air enters an air inlet side 501 of electronics rack 500 to cool electronic components within the electronics rack, and subsequently is expelled as heated air through the back 502 of the electronics rack. To facilitate this airflow, electronics rack 500 may include one or more air-moving devices 510 (FIG. 5A), such as fans or blowers, which provide a forced inlet-to-outlet airflow to cool the electronic components within the electronic subsystems of the electronics rack.

Figure 5B:
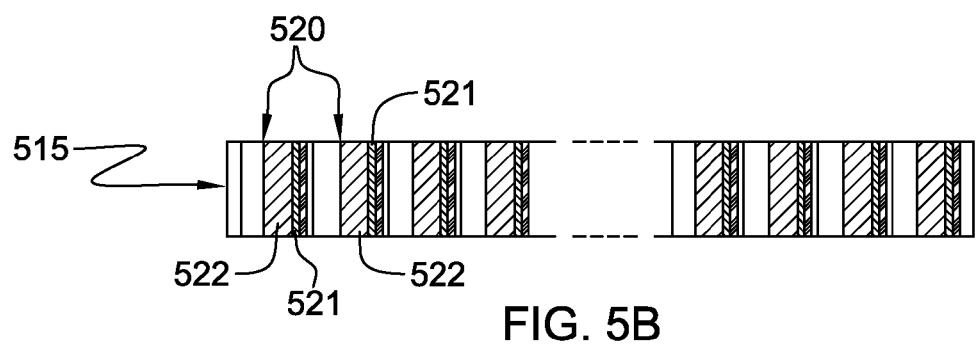
FIG. 5B is a cross-sectional elevational view through one row of vertically-oriented electronic subsystems of the electronics rack embodiment of FIG. 5A, taken along line 5B-5B thereof, and to be modified with a liquid-cooled cooling apparatus, in accordance with an aspect of the present invention.

In FIGS. 5A & 5B, multiple electronic subsystems 520 are illustrated in a row 515, each comprising a circuit board 521 or other supporting substrate, with a plurality of heat-generating electronic components 522 disposed thereon, which in one embodiment may comprise the same type or different types of electronic modules. For example, each heat-generating electronic component 522 might comprise a disk drive, with each circuit board 521 supporting an array of disk drives requiring cooling. In other embodiments, the heat-generating components may comprise different types of electronic components, such as circuit modules, processors, memory, or other logic devices of varying sizes and shapes requiring cooling.

Each electronic subsystem 520 in FIGS. 5A-6B is a vertically-oriented electronic subsystem (as one example only) which docks and undocks relative to the electronics rack, and in particular, relative to an electrical backplane 530 (FIG. 5A). Electrical backplane 530 provides power and communications connections between the electronic subsystems. As one detailed example, each electronic subsystem is a blade of a multi-blade center system.

Figure 6B:
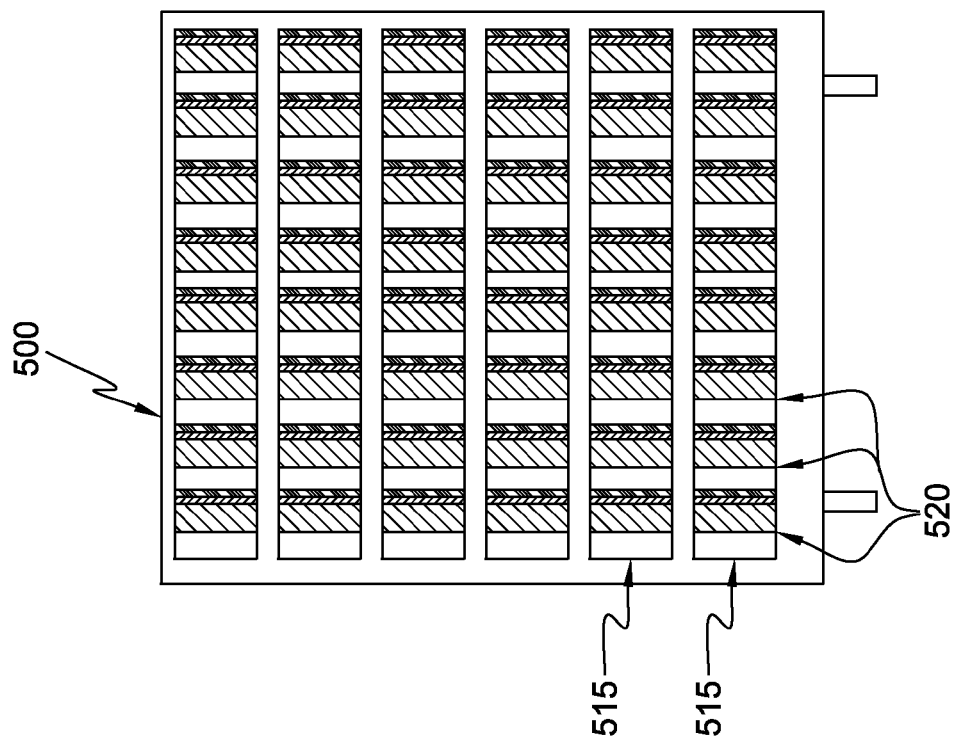
FIG. 6B is a cross-sectional elevational view of the air-cooled electronics rack of FIG. 6A, taken along line 6B-6B thereof, to be modified with a liquid-cooled cooling apparatus, in accordance with an aspect of the present invention.
Figure 6A:
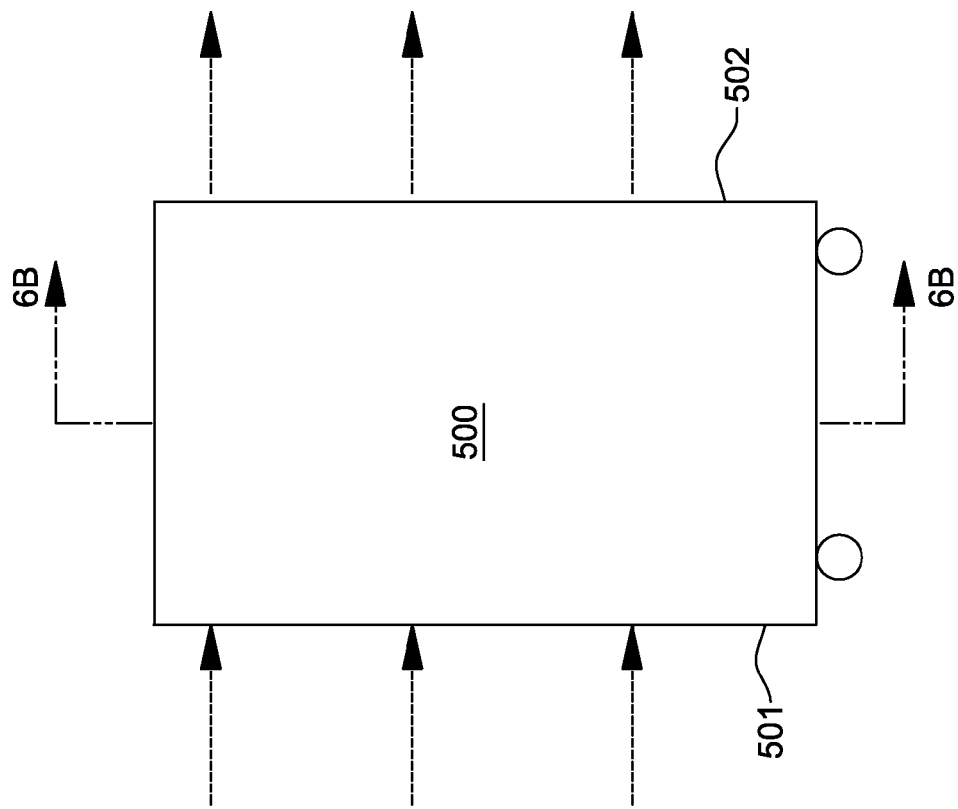
FIG. 6A is a side elevational view of the air-cooled electronics rack of FIGS. 5A & 5B to be modified with a liquid-cooled cooling apparatus, in accordance with an aspect of the present invention.

As illustrated in FIG. 6B, multiple rows 515 of electronic subsystems may be provided within the electronics rack, depending upon the implementation. An example of this type of packaging arrangement is provided by the blade center systems offered by International Business Machines Corporation, of Armonk, N.Y., with the blade servers being one example of an electronic subsystem to be cooled.

FIGS. 7-10 described below provide one example of a cooling apparatus, a liquid-cooled electronics rack, and methods of fabrication thereof, in accordance with an aspect of the present invention.

Figure 7:
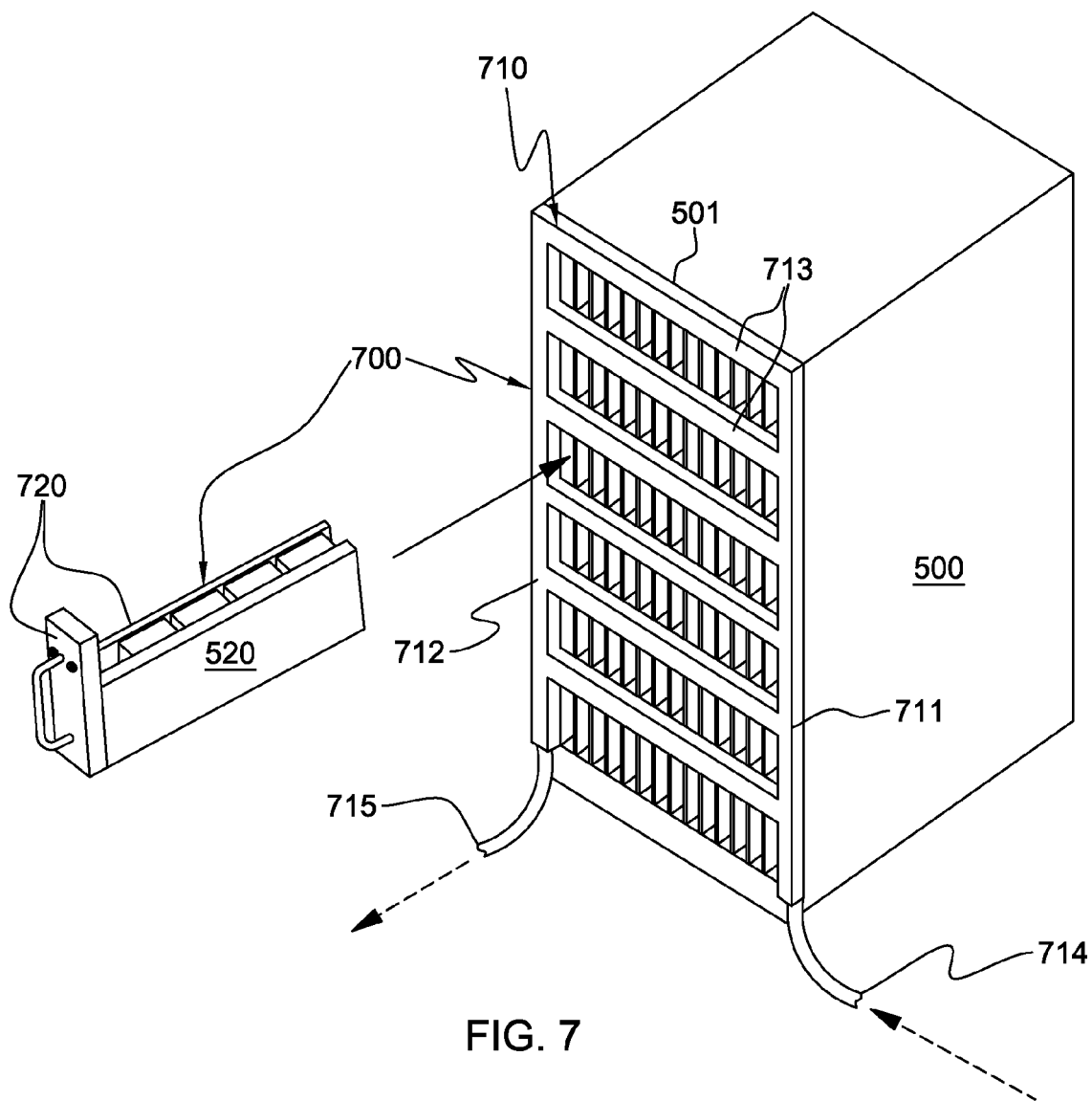
FIG. 7 is a partially exploded perspective view of one embodiment of a liquid-cooled electronics rack, in accordance with an aspect of the present invention.

As illustrated in the liquid-cooled electronics rack of FIG. 7, the cooling apparatus 700 includes a liquid-cooled cooling structure 710 mounted to the front 501 (in one embodiment) of electronics rack 500, as well as multiple L-shaped heat transfer elements 720, each coupled to one or more heat-generating components of a respective electronic subsystem 520 to be cooled. As used herein, "front" of electronics rack 500 refers to the access plane through which electronic subsystems are docked or undocked relative to the plurality of respective subsystem docking ports defined within the electronics rack. Further, when docked, and electronic subsystem is assumed to be electrically coupled to the electrical backplane of the electronics rack such that the electronic subsystem is operationally disposed within the electronic rack.

In the illustrated embodiment, liquid-cooled cooling structure 710 is a monolithic structure which comprises a coolant inlet plenum 711, a coolant outlet plenum 712 and multiple horizontally-extending, liquid-cooled cooling bars 713, to which L-shaped heat transfer elements 720 physically contact and/or attach when the respective electronic subsystems 520 are docked within the electronics rack. As illustrated, coolant inlet plenum 711 is coupled in fluid communication to a coolant supply source, such as a system or facility water source, via supply tube 714, and coolant outlet plenum 712 is coupled in fluid communication to a coolant return, such as a system or facility water return, via a return tube 715. As explained further below, heat generated by one or more heat-generating electronic components of electronic subsystem 520 is transferred via conduction through a thermal transport path passing through the L-shaped heat transfer element to a respective liquid-cooled cooling bar 713, such as a tubular cooling bar structure attached to the front of the electronics rack. The liquid-cooled cooling bar 713 transfers heat by convection to coolant (for example, water) flowing through one or more coolant-carrying channels within the liquid-cooled cooling bar, and the coolant carries the heat away for rejection via, for example, the customer's facility water system. Thermal conduction can be facilitated by providing a breakable thermal interface, such as a thermal grease, a thermally conductive pad, or other interstitial thermally conductive layer, between each heat transfer member and the respective liquid-cooled cooling bar 713 to ensure that the heat transfer member and respective liquid-cooled cooling bar are thermally interfaced with a good thermal conductive path therebetween.

As illustrated in FIG. 7, electronics rack 500 includes multiple rows of subsystem docking ports into which blade-like electronic subsystems are slidably inserted for docking or plugging into one or more electrical backplanes of the electronics rack. Advantageously, by providing liquid-cooled cooling structure 710 as a monolithic structure (in one embodiment), an integrated structure is presented wherein the multiple cooling bars and manifold structures are unitarily formed to minimize coolant connections at the electronics rack. In this embodiment, a single coolant supply connection and a single coolant return connection is utilized at the bottom of the electronics rack at the front right and left sides, respectively.

Figure 8A:
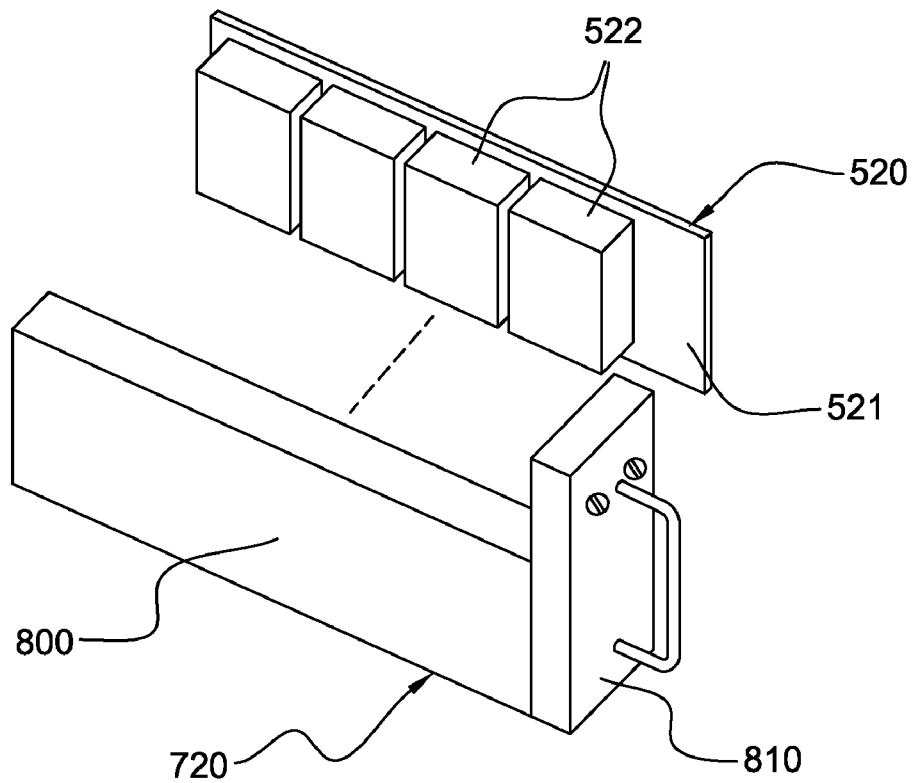
FIG. 8A is a partially exploded view of an electronic subsystem and an L-shaped heat transfer element of the cooling apparatus of the liquid-cooled electronics rack of FIG. 7, in accordance with an aspect of the present invention.
Figure 8B:
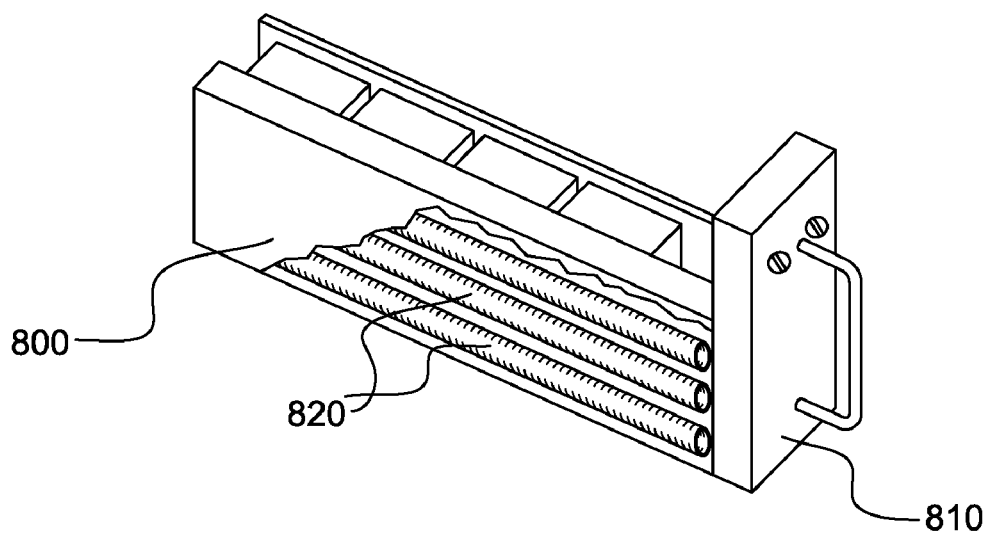
FIG. 8B is a partial cut-away view of the L-shaped heat transfer element of FIG. 8A, illustrating a heat pipe within the horizontally-extending heat transfer member of the L-shaped heat transfer element of the cooling apparatus of the liquid-cooled electronics rack of FIG. 7, in accordance with an aspect of the present invention.

FIG. 8A depicts a simplified exploded view of a blade-like electronic subsystem 520 and an L-shaped heat transfer element 720, in accordance with the cooled electronics rack embodiment of FIG. 7. As illustrated, electronic subsystem 520 is a blade-type package assembly which comprises a circuit board 521 and multiple electronic components or modules 522 disposed on the circuit board. One or more electrical connectors (not shown) would also be provided at one edge of the circuit board to plug the electronic subsystem into a respective electrical backplane of the electronics rack when the electronic subsystem is docked within the electronics rack.

As illustrated, L-shaped heat transfer element 720 includes a horizontally-extending portion 800 and a vertically-extending portion 810. In the illustrated embodiment, the horizontally-extending portion is a horizontally-extending heat transfer member which is metallurgically affixed at one end to the vertically-extending portion 810. Alternatively, horizontally-extending portion 800 and vertically-extending portion 810 could comprise different portions of a monolithic structure configured as illustrated in FIG. 8A. Such a monolithic structure, whether L-shaped or T-shaped (as discussed below in reference to FIG. 11), would potentially provide the best heat transfer through the heat transfer element. The vertically-extending portion is (in one embodiment) a thermal interface plate which is attached to the end of the horizontally-extending heat transfer member and physically contacts a respective liquid-cooled cooling bar, as described further below. Metal clips (not shown) or similar fasteners may be used to secure the horizontally-extending heat transfer member 800 to, for example, the circuit board 521 of the electronic subsystem 520 in order that the heat transfer member is in contact with one or more electronic components 522 to be cooled. Thermal conduction can be facilitated by providing an epoxy, a thermal grease, a thermally conductive pad, or other interstitial thermally conductive layer, between the heat transfer member and the respective heat-generating components to be cooled to ensure that the member and components are thermally interfaced with a good thermal conduction path between the components and heat transfer member. Protrusions or lands may be employed on the main surface of the heat transfer member facing the components to ensure contact to components (not shown) of varying height above the circuit board 521. Note that although shown in FIG. 8A as two separate components, the L-shaped heat transfer element could be fabricated as a unitary structure comprising a thermally conductive material which is configured to form the thermal transport path therethrough.

In one embodiment, the horizontally-extending heat transfer member 800 comprises one or more heat pipes 820, and the thermal interface plate 810 may be a solid, thermally conductive plate, or itself also comprise one or more heat pipes. In the illustrated example, three cylindrical-shaped heat pipes are shown embedded within the horizontally-extending heat transfer member. As is well known, a heat pipe may comprise a hollow structure that allows heat to migrate from one end of the structure to another via a flow of vapor and provides a return of liquid condensate under the action of capillary force via a wick or screen-like matrix. A high concentration of vapor may exist closer to the heat source, with a lower concentration of vapor at the condenser end of the heat pipe. The result is a mass flow from one end to the other end of the member, taking advantage of the latent thermal capacity of the vapor to carry heat from one end to the other. In one embodiment, the illustrated heat transfer member of FIG. 8B can be fabricated by drilling appropriately sized holes in a block of thermally conductive material, such as copper or aluminum, after which the cylindrical-shaped heat pipes may be inserted therein.

Figure 9:
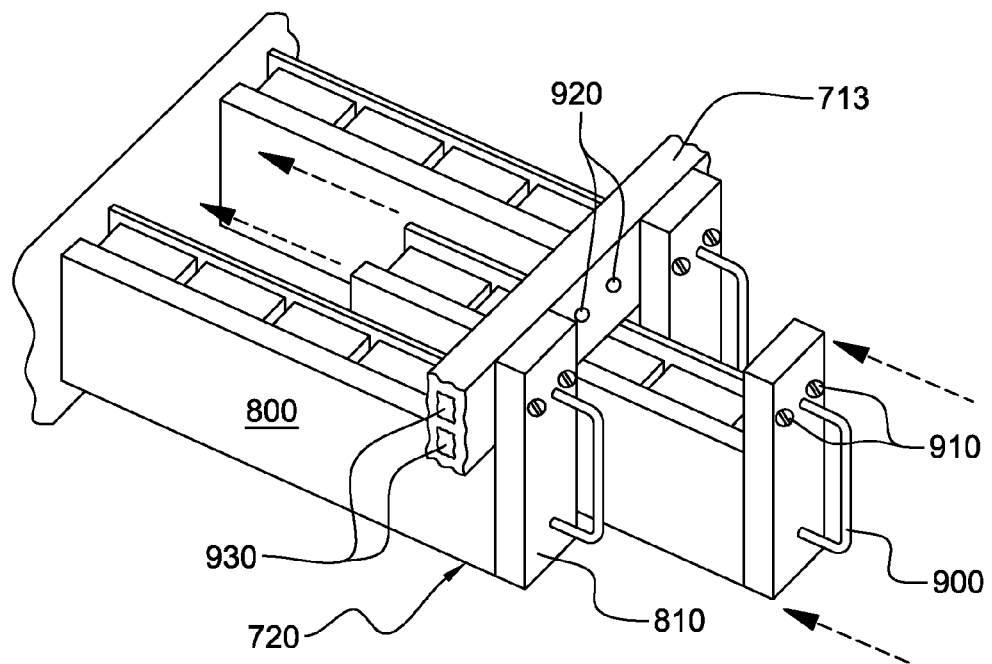
FIG. 9 is a partial perspective view of several electronic subsystems and the cooling apparatus of the liquid-cooled electronics rack of FIG. 7, in accordance with an aspect of the present invention.
Figure 10:
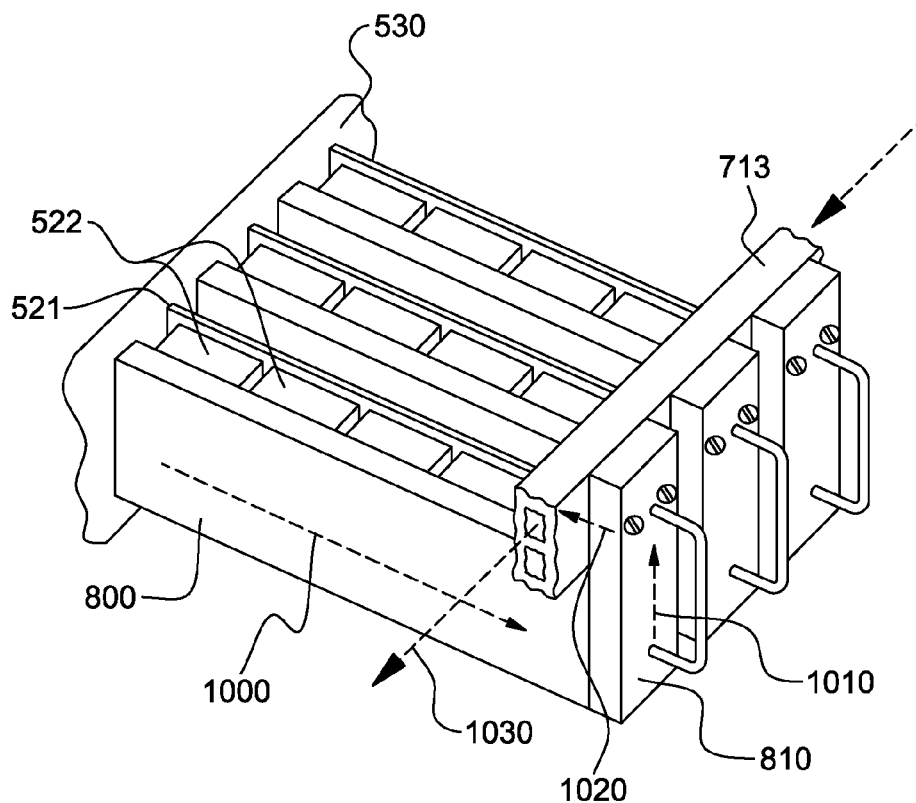
FIG. 10 is a partial perspective view of the structures of FIG. 9, illustrating three electronic subsystems docked in operative position with the heat-generating electronic components thereof in physical contact with respective L-shaped heat transfer elements, which provide thermal transport paths to the liquid-cooled cooling structure(s) of the cooling apparatus, in accordance with an aspect of the present invention.

FIGS. 9 & 10 illustrate a partial embodiment of a liquid-cooled electronics rack, such as depicted in FIG. 7, with FIG. 9 illustrating sliding of a cooled electronics subsystem assembly comprising an electronics subsystem and L-shaped heat transfer element coupled thereto into a corresponding subsystem docking slot in the liquid-cooled electronics rack, and FIG. 10 illustrating the cooled electronic subsystem assembly in the docked position within the electronics rack with the L-shaped heat transfer element physically contacting the liquid-cooled cooling bar 713.

As shown in FIG. 9, a handle 900 is provided attached to each thermal interface plate 810 for facilitating insertion and removal of the cooled electronic subsystem assembly into the electronics rack. In this embodiment, two retention elements 910 (e.g., screws) are employed for threadable attachment to threaded openings 920 in the illustrated liquid-cooled cooling bar 713 to facilitate good physical contact of the thermal interface plate to the cooling bar, and therefore a good thermal transport path from the thermal interface plate to the cooling bar. The retention screws are provided by way of example only. Any means for providing a mechanical loading to achieve a good thermal interface between the thermal interface plate and the cooling bar may be used as the retention element. For example, a single retention screw or a clamp mechanism could be employed.

In the embodiment illustrated in FIG. 9, the liquid-cooled cooling bar 713 includes two coolant-carrying channels 930 extending therethrough. The coolant-carrying channels are configured to extend from one side to the other side of the cooling bar to allow coolant (such as water) to freely flow through the cooling bar from the coolant inlet plenum to the coolant outlet plenum of the cooling apparatus (see FIG. 7). Note that two coolant channels are depicted in FIG. 9 by way of example only. A single coolant channel could be employed, or more than two coolant channels could be used. Further, although not shown, ribs (or fins) may be provided in the coolant-carrying channels or passages through the cooling bar to increase the heat transfer area for convective heat transfer from the thermal interface plates to the coolant flowing through the liquid-cooled cooling bar.

FIG. 10 depicts the structure of FIG. 9, with the cooled electronic subsystem assemblies fully docked within the electronics rack, and the electrical connectors of the electronic subsystems engaging the electrical backplane 530 of the electronics rack for electrical power and signal distribution. As shown, in one embodiment, the thermal interface plate 810 extends in elevation above the height of the circuit board 521 in order to contact the respective liquid-cooled cooling bar 713. Once a cooled electronic subsystem assembly connects with the electrical connectors in the rack's backplane, retention elements on the front face of the thermal interface plate are tightened to lock the assembly into position and ensure good thermal contact between the thermal interface plate and the horizontally-extending cooling bar of the cooling apparatus. In operation, heat flows via conduction from one or more heat-generating electronic components 522 to the heat transfer member, and then through path 1000 in the horizontally-extending heat transfer member 800 (comprising, e.g., a heat pipe), up path 1010 in the thermal interface plate 810 and across the physical interface 1020 to the wall of the horizontally-disposed, liquid-cooled cooling bar 713, and hence to coolant flowing 1030 through the coolant-carrying channels extending therethrough.

Note that docking, as well as undocking of one or more of the cooled electronic subsystem assemblies does not effect flow of coolant through the liquid-cooled cooling structure, such as through the horizontally-extending cooling bars of the structure. No coolant connectors need to be broken in order to slidably undock a cooled electronic subsystem assembly from the electronics rack or to dock the cooled electronic subsystem assembly within the electronics rack.

Figure 11:
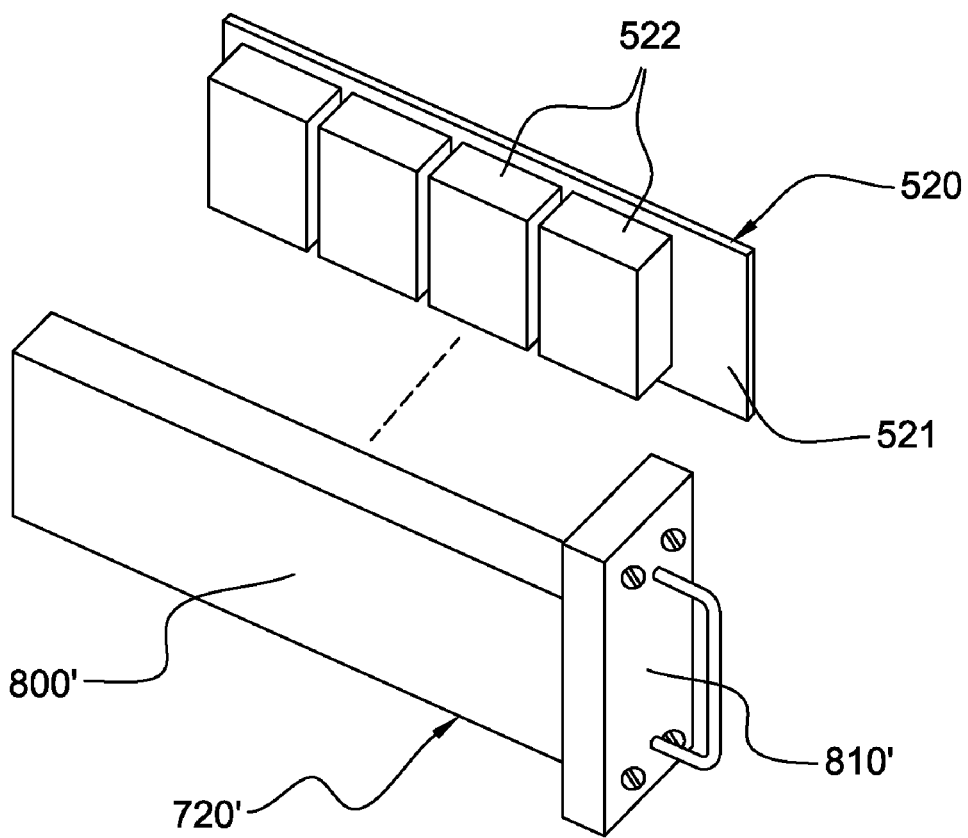
FIG. 11 is a partially exploded view of an electronic subsystem and a T-shaped heat transfer element for the cooling apparatus of the liquid-cooled electronics rack of FIG. 7, in accordance with an aspect of the present invention.

FIG. 11 depicts a simplified exploded view of blade-like electronic subsystem 520 and a T-shaped heat transfer element 720', which can be employed in accordance with the cooled electronics rack embodiment of FIG. 7. As illustrated, in this alternate embodiment, the T-shaped heat transfer element 720' again includes a horizontally-extending portion 800' and a vertically-extending portion 810'. The horizontally-extending portion is a horizontally-extending heat transfer member which may be metallurgically affixed at one end to the vertically-extending portion 810'. Alternatively, the T-shaped heat transfer element may be formed as a monolithic structure. The vertically-extending portion is (in one embodiment) a thermal interface plate which is attached to the end of the horizontally-extending heat transfer member and sized and configured to physically contact respective upper and lower liquid-cooled cooling bars of the liquid-cooled cooling structure, such as depicted in FIG. 7. As illustrated, multiple sets of retention elements may be employed to threadably attach the vertically-extending portion 810' to both upper and lower liquid-cooled cooling bars (not shown) to facilitate good physical contact of the vertically-extending portion with the upper and lower cooling bars, and therefore provide a good thermal transport path into the cooling bars. Again, retention screws are provided by way of example only. Any means for providing mechanical loading to achieve a good thermal interface between the vertically-extending portion and the respective cooling bars may be used as a retention element.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus for facilitating cooling of an electronic subsystem, the cooling apparatus comprising:
   a liquid-cooled cooling structure configured to mount to a front of a housing within which the electronic subsystem is configured to dock, the electronic subsystem being slidable relative to the housing through the front of the housing, for docking or undocking thereof relative to the housing, the liquid-cooled cooling structure comprising a thermally conductive material and comprising at least one coolant-carrying channel extending therethrough; and a heat transfer element configured to couple to one or more heat-generating components of the electronic subsystem, and configured to physically contact the liquid-cooled cooling structure when the liquid-cooled cooling structure is mounted to the front of the housing, the heat transfer element is coupled to the one or more heat generating components of the electronic subsystem and the electronic subsystem is docked within the housing, wherein each heat transfer element physically engages the liquid-cooled cooling structure external the housing as the electronic subsystem coupled thereto is slidably docked within the housing, and wherein the heat transfer element provides a thermal transport path from the one or more heat-generating components of the electronic subsystem coupled thereto, when docked within the housing, to the liquid-cooled cooling structure mounted to the front of the housing, and wherein the electronic subsystem is dockable within or undockable from the housing without affecting flow of coolant through the liquid-cooled cooling structure.

2. The cooling apparatus of claim 1, wherein the heat transfer element comprises a horizontally-extending heat transfer member configured to couple to the one or more heat-generating components of the electronic subsystem and a vertically-extending thermal interface plate coupled to one end of the horizontally-extending heat transfer member, the thermal transport path passing through the horizontally-extending heat transfer member and the vertically-extending thermal interface plate.

3. The cooling apparatus of claim 2, wherein the vertically-extending thermal interface plate is connected at a first end thereof to the horizontally-extending heat transfer member and is configured to physically contact at a second end thereof to the liquid-cooled cooling structure when the liquid-cooled cooling structure is mounted to the front of the housing, the heat transfer element is coupled to the one or more heat-generating components of the electronic subsystem, and the electronic subsystem is docked within the housing.

4. The cooling apparatus of claim 3, wherein at least one of the horizontally-extending heat transfer member or the vertically-extending thermal interface plate comprises a heat pipe defining a portion of the thermal transport path and facilitating transport of heat generated by the one or more heat-generating components of the electronic subsystem to the liquid-cooled cooling structure.

5. The cooling apparatus of claim 2, wherein the vertically-extending thermal interface plate comprises a handle, which when the heat transfer element is coupled to the one or more heat-generating components of the electronic subsystem, facilitates slidable docking or undocking of the electronic subsystem relative to the housing, through the front of the housing, and wherein the vertically-extending thermal interface plate further comprises at least one retention element configured to facilitate maintaining physical contact of the vertically-extending thermal interface plate to the liquid-cooled cooling structure when the liquid-cooled cooling structure is mounted to the front of the housing, the heat transfer element is coupled to the one or more heat-generating components, and the electronic subsystem is docked within the housing.

6. The cooling apparatus of claim 2, wherein the liquid-cooled cooling structure comprises at least one horizontally-extending, liquid-cooled cooling bar configured to cool multiple electronic subsystems via multiple, respective heat transfer elements configured to couple thereto.

7. The cooling apparatus of claim 1, wherein the liquid-cooled cooling structure comprises multiple liquid-cooled cooling bars with coolant-carrying channels extending therethrough, and wherein the liquid-cooled cooling structure further comprises a coolant inlet plenum and a coolant outlet plenum in fluid communication with the multiple coolant-carrying channels extending through the liquid-cooled cooling bars, the liquid-cooled cooling structure being a monolithic structure configured to attach to the front of the housing, and wherein the housing is an electronics rack comprising multiple electronic subsystems.

8. The cooling apparatus of claim 1, wherein the electronic subsystem comprises multiple heat-generating components to be cooled, and wherein the heat transfer element comprises a horizontally-extending portion and a vertically-extending portion, the horizontally-extending portion being thermally interfaced to at least some heat-generating components of the multiple heat-generating components to be cooled, and the vertically-extending portion being sized and configured to physically contact the liquid-cooled cooling structure when the liquid-cooled cooling structure is mounted to the front of the housing, and the electronic subsystem is docked within the housing.

9. A liquid-cooled electronics rack comprising:
an electronics rack comprising a plurality of subsystem docking ports;
a plurality of electronic subsystems slidable relative to the plurality of subsystem docking ports through a front of the electronics rack for docking or undocking thereof relative to the electronics rack; and
a cooling apparatus for facilitating cooling of the plurality of electronic subsystems when docked within the electronics rack, the cooling apparatus comprising:
a liquid-cooled cooling structure mounted to the front of the electronics rack, the liquid-cooled cooling structure comprising a thermally conductive material and comprising at least one coolant-carrying channel extending therethrough; and
a plurality of heat transfer elements, each heat transfer element being coupled to one or more heat-generating components of a respective electronic subsystem of the plurality of electronic subsystems, and configured to physically contact the liquid-cooled cooling structure when the electronic subsystem is docked within the electronics rack, wherein each heat transfer element physically engages the liquid-cooled cooling structure external the housing as the respective electronic subsystem coupled thereto is slidably docked within the housing, and wherein each heat transfer element provides a thermal transport path from the one or more heat-generating components of the respective electronic subsystem coupled thereto, and docked within the housing, to the liquid-cooled cooling structure mounted to the front of the housing, and wherein the plurality of electronic subsystems are dockable within or undockable from the electronics rack without affecting flow of coolant through the liquid-cooled cooling structure.

10. The liquid-cooled electronics rack of claim 9, wherein the liquid-cooled cooling structure comprises multiple liquid-cooled cooling bars extending across the front of the electronics rack, each liquid-cooled cooling bar comprising at least one coolant-carrying channel extending therethrough, and wherein the liquid-cooled cooling structure further comprises a coolant inlet plenum and a coolant outlet plenum in fluid communication with the coolant-carrying channels of the multiple liquid-cooled cooling bars extending across the front of the electronics rack, wherein the coolant inlet plenum and the coolant outlet plenum are vertically-oriented plenums mounted to the front of the electronics rack.

11. The liquid-cooled electronics rack of claim 10, wherein the liquid-cooled cooling structure is a monolithic structure, and wherein the electronics rack comprising multiple rows of subsystem docking ports, and the multiple liquid-cooled cooling bars facilitate cooling of docked electronic subsystems within the multiple rows of subsystem docking ports.

12. The liquid-cooled electronics rack of claim 9, wherein each heat transfer element comprises a horizontally-extending heat transfer member coupled to the one or more heat-generating components of the respective electronic subsystem and a vertically-extending thermal interface plate extending from the one end of the horizontally-extending heat transfer member, wherein the respective thermal transport path passes through the horizontally-extending heat transfer member and the vertically-extending thermal interface plate.

13. The liquid-cooled electronics rack of claim 12, wherein the vertically-extending thermal interface plate is connected at a first end thereof to the horizontally-extending heat transfer member and is configured to physically contact at a second end thereof to the liquid-cooled cooling structure when the respective electronic subsystem is docked within a subsystem docking port of the plurality of subsystem docking ports of the electronics rack.

14. The liquid-cooled electronics rack of claim 13, wherein at least one of the horizontally-extending heat transfer member or the vertically-extending thermal interface plate of at least one heat transfer element of the plurality of heat transfer elements comprises a heat pipe defining a portion of the thermal transport path thereof and facilitating transport of heat generated by the one or more heat-generating components of the respective electronic subsystem to the liquid-cooled cooling structure.

15. The liquid-cooled electronics rack of claim 12, wherein the vertically-extending thermal interface plates of the plurality of heat transfer elements each comprises a handle to facilitate slidable docking or undocking of the respective electronic subsystem relative to the electronics rack, and at least one retention element configured to facilitate maintaining physical contact of the vertically-extending thermal interface plate to the liquid-cooled cooling structure when the respective electronic subsystem is docked within the electronics rack.

16. The liquid-cooled electronics rack of claim 12, wherein the liquid-cooled cooling structure comprises multiple horizontally-extending, liquid-cooled cooling bars, each horizontally-extending, liquid-cooled cooling bar being configured to cool multiple electronic subsystems via multiple, respective heat transfer elements coupled thereto.

17. A method of fabricating a liquid-cooled electronics rack comprising:
employing an electronics rack comprising a plurality of subsystem docking ports, and a plurality of electronic subsystems slidable relative to the plurality of subsystem docking ports for docking or undocking of the plurality of electronic subsystems relative to the electronics rack; and
providing a cooling apparatus for facilitating cooling of the plurality of electronic subsystems when docked within the electronics rack, wherein providing the cooling apparatus comprises:
mounting a liquid-cooled cooling structure to the electronics rack adjacent to the plurality of subsystem docking ports, the liquid-cooled cooling structure comprising a thermally conductive material and comprising at least one coolant-carrying channel extending therethrough; and
providing a plurality of heat transfer elements, and securing each heat transfer element to one or more heat-generating components of a respective electronic subsystem of the plurality of electronic subsystems, each heat transfer element being configured to physically contact the liquid-cooled cooling structure when the respective electronic subsystem is docked within the electronics rack, wherein each heat transfer element physically engages the liquid-cooled cooling structure external the housing as the respective electronic subsystem coupled thereto is slidably docked within the housing, and wherein each heat transfer element provides a thermal transport path from the one or more heat-generating components of the respective electronic subsystem coupled thereto, when docked within the housing, to the liquid-cooled cooling structure mounted to the front of the housing, and wherein the electronic subsystems are dockable within or undockable from the electronics rack without affecting flow of coolant through the liquid-cooled cooling structure.

18. The method of claim 17, wherein the liquid-cooled cooling structure comprises multiple liquid-cooled cooling bars extending across the front of the electronics rack, the plurality of subsystem docking ports of the, electronics rack being accessible through the front of the electronics rack, and each liquid-cooled cooling bar comprising at least one coolant-carrying channel extending therethrough, and wherein the liquid-cooled cooling structure further comprises a coolant inlet plenum and a coolant outlet plenum in fluid communication with the coolant-carrying channels of the multiple liquid-cooled cooling bars extending across the front of the electronics rack, and wherein the method further comprises mounting the coolant inlet plenum and the coolant outlet plenum vertically to the front of the electronics rack, and mounting the multiple liquid-cooled cooling bars horizontally across the front of the electronics rack.

19. The method of claim 18, wherein providing the liquid-cooled cooling structure comprises providing the liquid-cooled cooling structure as a monolithic structure comprising the coolant inlet plenum, coolant outlet plenum and multiple liquid-cooled cooling bars, wherein the electronics rack comprises multiple rows of subsystem docking ports, and the multiple liquid-cooled cooling bars facilitate cooling of docked electronic subsystems within the multiple rows of subsystem docking ports utilizing the plurality of heat transfer elements.

20. The method of claim 17, wherein providing the plurality of heat transfer elements further comprises physically connecting each heat transfer element to at least one heat-generating component of a respective electronics subsystem, and providing each heat transfer element with at least one retention element configured to facilitate maintaining physical contacting of the heat transfer element to the liquid-cooled cooling structure when the respective electronic subsystem is docked within the electronics rack.

21. The cooling apparatus of claim 1, wherein the heat transfer element is one of an L-shaped heat transfer element or a T-shaped heat transfer element.

22. The cooling apparatus of claim 1, wherein the liquid-cooled cooling structure attaches to the front of the housing and resides external the housing.

23. The cooling apparatus of claim 22, wherein the heat transfer element physically engages the liquid-cooled cooling structure, as the respective electronic subsystem coupled thereto is slidably docked within the housing, in a direction perpendicular to a direction of slidable docking of the electronic subsystem within the housing.

* * * * *